US012751250B2

(12) United States Patent
Inayoshi et al.

(10) Patent No.: US 12,751,250 B2
(45) Date of Patent: Sep. 29, 2026

(54) HOLDING APPARATUS

(71) Applicant: Niterra Co., Ltd., Nagoya (JP)

(72) Inventors: Akira Inayoshi, Nagoya (JP); Masaki Tsuji, Nagoya (JP); Yasuhiko Inui, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 164 days.

(21) Appl. No.: 18/787,424

(22) Filed: Jul. 29, 2024

(65) Prior Publication Data

US 2025/0054799 A1 Feb. 13, 2025

(30) Foreign Application Priority Data

Aug. 8, 2023 (JP) ................................. 2023-129159

(51) Int. Cl.
*H10P 72/72* (2026.01)
*H01J 37/32* (2006.01)

(52) U.S. Cl.
CPC ...... *H10P 72/722* (2026.01); *H01J 37/32715* (2013.01); *H01J 2237/2007* (2013.01); *H01J 2237/334* (2013.01)

(58) Field of Classification Search
CPC .... H10P 72/722; H10P 72/0432; H10P 72/72; H10P 72/7616; H10P 72/0402; H10P 72/7624; H01J 37/32715; H01J 2237/2007; H01J 2237/334; H01J 37/32724; H01J 37/20
(Continued)

(56) References Cited

U.S. PATENT DOCUMENTS 7,547,407 B2 6/2009 Matsuda et al.
2005/0024809 A1* 2/2005 Kuchimachi .......... H02N 13/00 361/234
2006/0012087 A1* 1/2006 Matsuda ............... C04B 35/111 264/619

FOREIGN PATENT DOCUMENTS

JP 2005-343733 A 12/2005
JP 2013077702 A * 4/2013 ............. B32B 15/14
(Continued)

OTHER PUBLICATIONS

Japan Patent Office, Notice of Transmittal of Written Opposition issued in corresponding Patent No. 7682232, mailed Dec. 11, 2025.
(Continued)

*Primary Examiner* — Sreeya Sreevatsa
(74) *Attorney, Agent, or Firm* — Stites & Harbison, PLLC; Jeffrey A. Haeberlin; Collin M. Aycock

(57) ABSTRACT

A holding apparatus includes a holding substrate that has a first surface and a second surface opposite the first surface. The holding substrate includes a plate member that contains a ceramic as a main component. An electrode layer is disposed in the plate member. The electrode layer contains a conductive material as a main component and a ceramic as a sub-component. The plate member includes a first dielectric layer disposed on a surface of the electrode layer facing the first surface and in which a content of the main component is 99% by mass or more, and a second dielectric layer disposed on a surface of the electrode layer facing the second surface and in which a content of the main component is 99% by mass or more. A fractal dimension of the surface of the electrode layer facing the first surface is 1.18 or more.

6 Claims, 12 Drawing Sheets

(58) Field of Classification Search
USPC .......................................................... 361/234
See application file for complete search history.

(56) References Cited

FOREIGN PATENT DOCUMENTS

| | | | | |
|---|---|---|---|---|
| JP | 5441020 | B1 | | 3/2014 |
| JP | 2020004748 | A | * | 1/2020 |

OTHER PUBLICATIONS

Japan Patent Office, Office Action (Notification of Reasons for Refusal) issued in corresponding Application No. JP 2023-129159, mailed Dec. 17, 2024.

* cited by examiner

HOLDING APPARATUS

BACKGROUND OF THE INVENTION

1. Field of the Invention

The present invention relates to a holding apparatus.

2. Description of the Related Art

An electrostatic chuck is used as a holding apparatus that holds a wafer (a semiconductor wafer) in semiconductor manufacturing. The electrostatic chuck includes a holding substrate (a ceramic substrate) mainly composed of alumina, which is an insulating ceramic. The wafer is held on a surface of the holding substrate due to electrostatic attraction. The electrostatic attraction is exerted when a voltage is applied to an electrode layer (a chuck electrode) that is provided in the holding substrate.

As for this kind of electrostatic chuck, there has been a need for applying great high-frequency power in plasma processing such as plasma etching in recent years. For this reason, high purity alumina (99.99% pure) that has, for example, excellent plasma resistance is used as a material that is included in a base material (a plate member) of the holding substrate (see, for example, PTL 1). When the base material of the holding substrate is composed of high purity alumina, there is a possibility that adhesion between the base material and the electrode layer that is formed therein decreases. For this reason, in the case of a holding substrate that includes a base material composed of high purity alumina, a conductive powder (Pd powder), a binder, and a metallizing paste that contains alumina powder to improve the adhesion to the base material are used when the electrode layer is formed. A three-dimensional mesh network composed of alumina is formed in the electrode layer composed of the metallizing paste so as to connect a first surface and a second surface to each other in a thickness direction, and accordingly, the adhesion between the electrode layer and the base material is ensured.

CITATION LIST

Patent Literature

PTL 1: Japanese Patent No. 5441020

SUMMARY OF THE INVENTION

The adhesion between the base material (the plate member) and the electrode layer needs to be ensured.

An increase in the amount of the alumina powder that is used when the electrode layer is formed results in an improvement in the adhesion between the electrode layer and the base material of the holding substrate, but poses a problem in that the thermal conductivity of the holding substrate (particularly, the vicinity of the electrode layer) decreases.

A first surface (an upper surface) of the holding substrate is heated due to the plasma processing, and heat is accordingly transferred, for example, through the holding substrate from the first surface toward a second surface (a lower surface). A base member faces the second surface. When the base member is heated, the base member is cooled by a cooling mechanism (such as a refrigerant flow path) that is provided therein. However, as a result of the increase in the amount of the alumina powder that is used when the electrode layer is formed, a portion composed of the alumina powder that has low thermal conductivity is formed, for example, in the electrode layer as described above, the portion hinders the transfer of the heat through the holding substrate, and heat removal properties of the holding substrate decrease.

It is an object of the present invention to provide a holding apparatus including a holding substrate in which adhesion between a plate member that contains a high purity ceramic as a main component and an electrode layer that is disposed in the plate member is excellent.

It is another object of the present invention to provide a holding apparatus including a holding substrate that has excellent heat removal properties (thermal conductivity) and in which adhesion between a plate member that contains a high purity ceramic as a main component and an electrode layer that is disposed in the plate member is excellent.

Solutions to the foregoing problem are as follows:

In accordance with an aspect of the invention, a holding apparatus includes a holding substrate that has a first surface on which an object is to be held and a second surface opposite the first surface, the holding substrate including a plate member that contains a ceramic as a main component and an electrode layer that is disposed in the plate member, that contains a conductive material as a main component, and that contains the ceramic as a sub-component, wherein the plate member includes a first dielectric layer that is disposed on a surface of the electrode layer facing the first surface and in which a content of the main component is 99% by mass or more, and a second dielectric layer that is disposed on a surface of the electrode layer facing the second surface and in which a content of the main component is 99% by mass or more, and wherein a fractal dimension D of the surface of the electrode layer facing the first surface is 1.18 or more.

The area ratio of the ceramic to an observation range that is set at a center of the electrode layer in a cross-section of the electrode layer in a thickness direction can be 30% or less.

Also, the ceramic may not be present in a form in which the ceramic connects the first dielectric layer and the second dielectric layer to each other in the cross-section of the electrode layer.

Further, an area ratio of the electrode layer to the first surface can be 80% or more when the plate member is viewed in plan view.

According to the present invention, a holding apparatus including a holding substrate in which adhesion between a plate member that contains a high purity ceramic as a main component and an electrode layer that is disposed in the plate member is excellent can be provided.

In addition, according to the present invention, a holding apparatus including a holding substrate that has excellent heat removal properties (thermal conductivity) and in which adhesion between a plate member that contains a high purity ceramic as a main component and an electrode layer that is disposed in the plate member is excellent can be provided.

DESCRIPTION OF THE PREFERRED EMBODIMENTS

First Embodiment

A holding apparatus 100 according to a first embodiment will now be described with reference to FIG. 1 to FIG. 5E. The holding apparatus 100 is an electrostatic chuck that attracts and holds an object (a wafer W) due to electrostatic attraction. For example, the electrostatic chuck is used as a table on which the wafer W is placed in an etching process that is performed in a decompressed chamber by using plasma.

Figure 1:
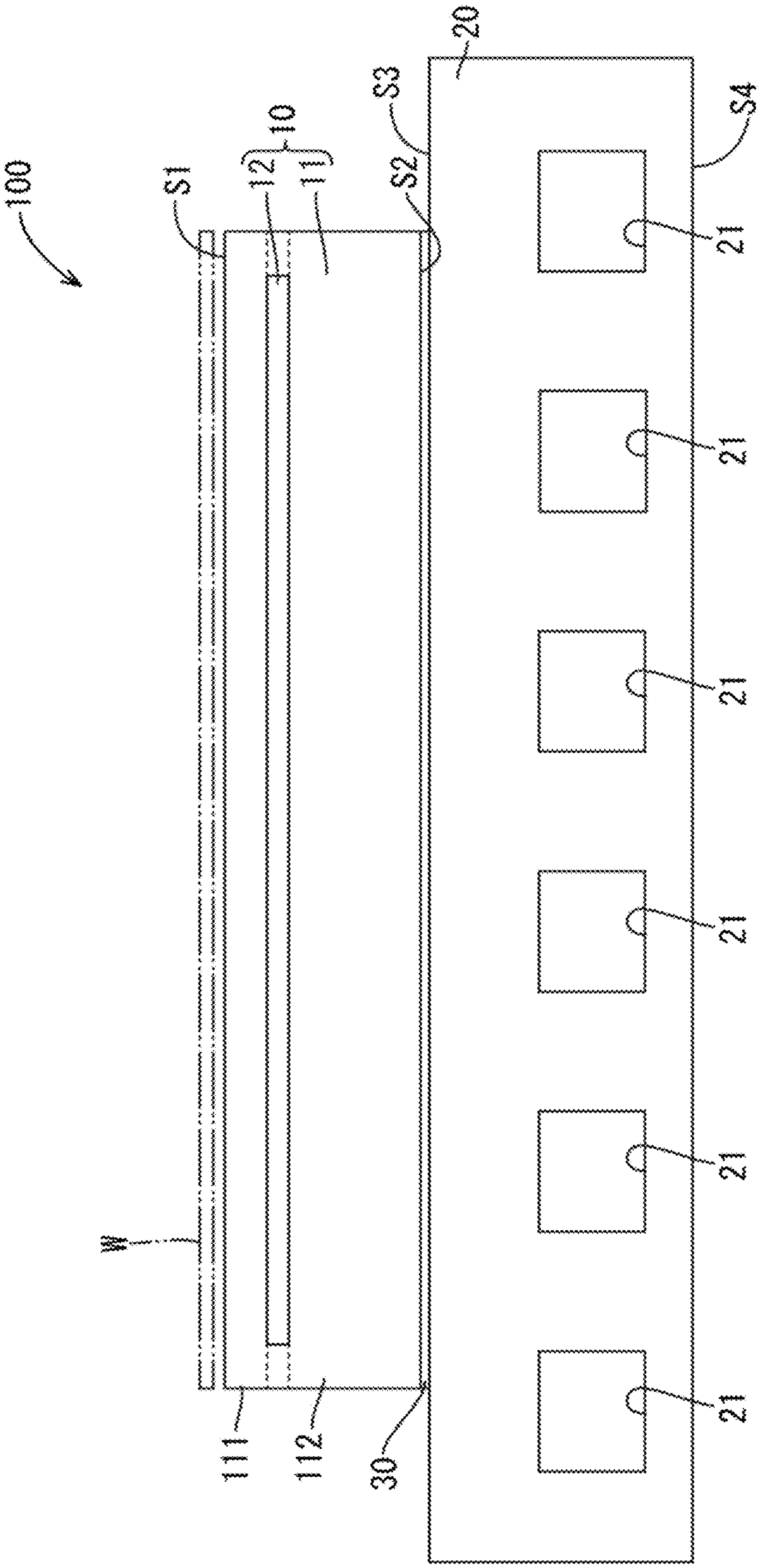
FIG. 1 schematically illustrates a sectional structure of a holding apparatus according to a first embodiment.

FIG. 1 schematically illustrates a sectional structure of the holding apparatus 100 according to the first embodiment. The holding apparatus 100 includes a holding substrate (a ceramic substrate) 10 that has a disk shape and a base member 20 that has a disk shape larger than the holding substrate 10. For example, in the case where the holding substrate 10 has a disk shape that has a diameter of 300 mm and a thickness of 3 mm, the base member 20 has a disk shape that has a diameter of 340 mm and a thickness of 20 mm.

The holding substrate 10 and the base member 20 are stacked in an up-down direction with the holding substrate 10 facing upward and the base member 20 facing downward. The holding substrate 10 and the base member 20 are joined to each other by using a joining material 30 that is interposed therebetween.

The holding substrate 10 has a first surface S1 that faces upward and that has a substantially disk shape and a second surface S2 that is opposite (that is, below) the first surface S1, that faces the base member 20, and that has a substantially disk shape. The base member 20 has a third surface S3 that faces upward, that faces the second surface S2, and that has a substantially disk shape and a fourth surface S4 that is opposite (that is, below) the third surface S3 and that has a substantially disk shape. The joining material 30 described above is interposed between the second surface S2 of the holding substrate 10 and the third surface S3 of the base member 20 and extends in a layered shape.

The holding substrate 10 includes a plate member (a base material) 11 that has a disk shape and an electrode layer 12 that is disposed in the plate member 11. An upper surface of the plate member 11 corresponds to the first surface S1 of the holding substrate 10. A lower surface (a back surface) of the plate member 11 corresponds to the second surface S2 of the holding substrate 10.

The plate member 11 is an insulating member that contains a ceramic as a main component and that has a plate shape (a disk shape). In the present specification, the "main component" means a component contained in the largest proportion. According to the present embodiment, the content of the main component in the plate member 11 is 99% by mass or more (preferably 99.5% by mass or more). According to the present embodiment, the main component of the plate member 11 is alumina ($Al_2O_3$). That is, the plate member 11 according to the present embodiment contains high purity alumina as the main component. According to another embodiment, the main component of the plate member may be another ceramic such as aluminum nitride (AlN), provided that it does not interfere with the objects of the present invention.

As illustrated in FIG. 1, the plate member 11 includes a first dielectric layer 111 that is disposed on a surface of the electrode layer 12 facing the first surface S1 and in which the content of the main component (alumina) is 99% by mass or more (preferably 99.5% by mass or more) and a second dielectric layer 112 that is disposed on a surface of the electrode layer 12 facing the second surface S2 and in which the content of the main component (alumina) is 99% by mass or more (preferably 99.5% by mass or more).

The electrode layer 12 is disposed in the plate member 11, contains a conductive material as a main component, and contains a ceramic as a sub-component.

The electrode layer 12 has a planar shape (a layered shape) substantially parallel with the first surface S1 as a whole. As illustrated in FIG. 1, the electrode layer 12 is disposed closer to the first surface S1 in the holding substrate 10 (the plate member 11).

The electrode layer 12 contains a conductive material such as tungsten (W), molybdenum (Mo), platinum (Pt), or palladium (Pd) as the main component. The electrode layer 12 contains, as the sub-component, the ceramic that is used as the main component of the plate member 11 described above. According to the present embodiment, the electrode layer 12 contains alumina ($Al_2O_3$) as the sub-component.

The electrode layer 12 according to the present embodiment is the chuck electrode and is connected to an external power supply via, for example, a terminal not illustrated. Power is supplied to the electrode layer 12, the electrostatic attraction is subsequently exerted, and the wafer W is attracted to and held on the first surface S1 of the holding substrate 10 due to the electrostatic attraction.

Figure 2:
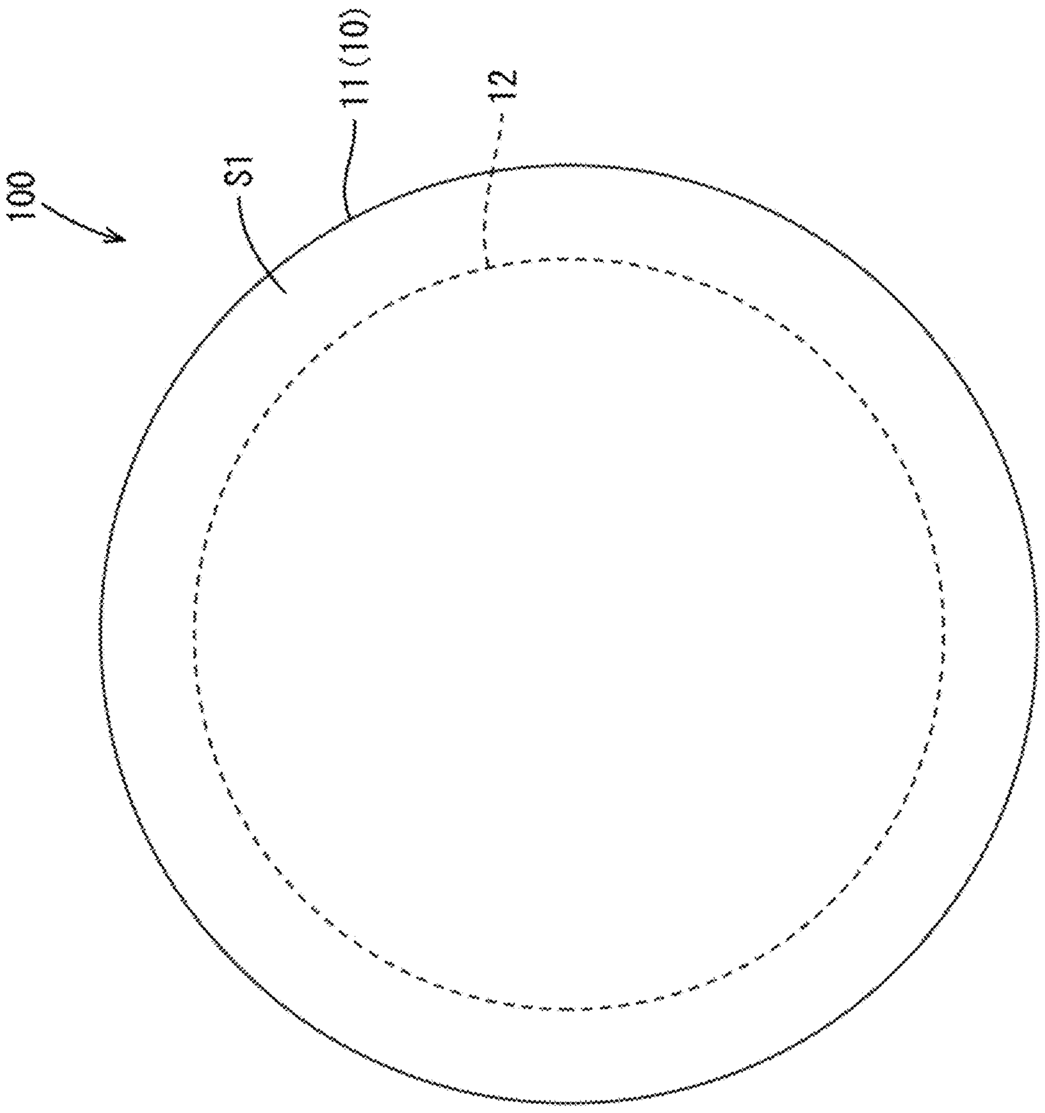
FIG. 2 schematically illustrates a holding substrate (a plate member) of the holding apparatus according to the first embodiment in plan view.

FIG. 2 schematically illustrates the holding substrate 10 (the plate member 11) of the holding apparatus 100 according to the first embodiment in plan view. As illustrated in FIG. 2, the area ratio of the electrode layer 12 to the first surface S1 is 80% or more when the plate member 11 is viewed in plan view. As illustrated in FIG. 2, the electrode layer 12 has a substantially disk shape in plan view and is disposed in the plate member 11 so as to overlap the majority of the first surface S1.

Figure 3:
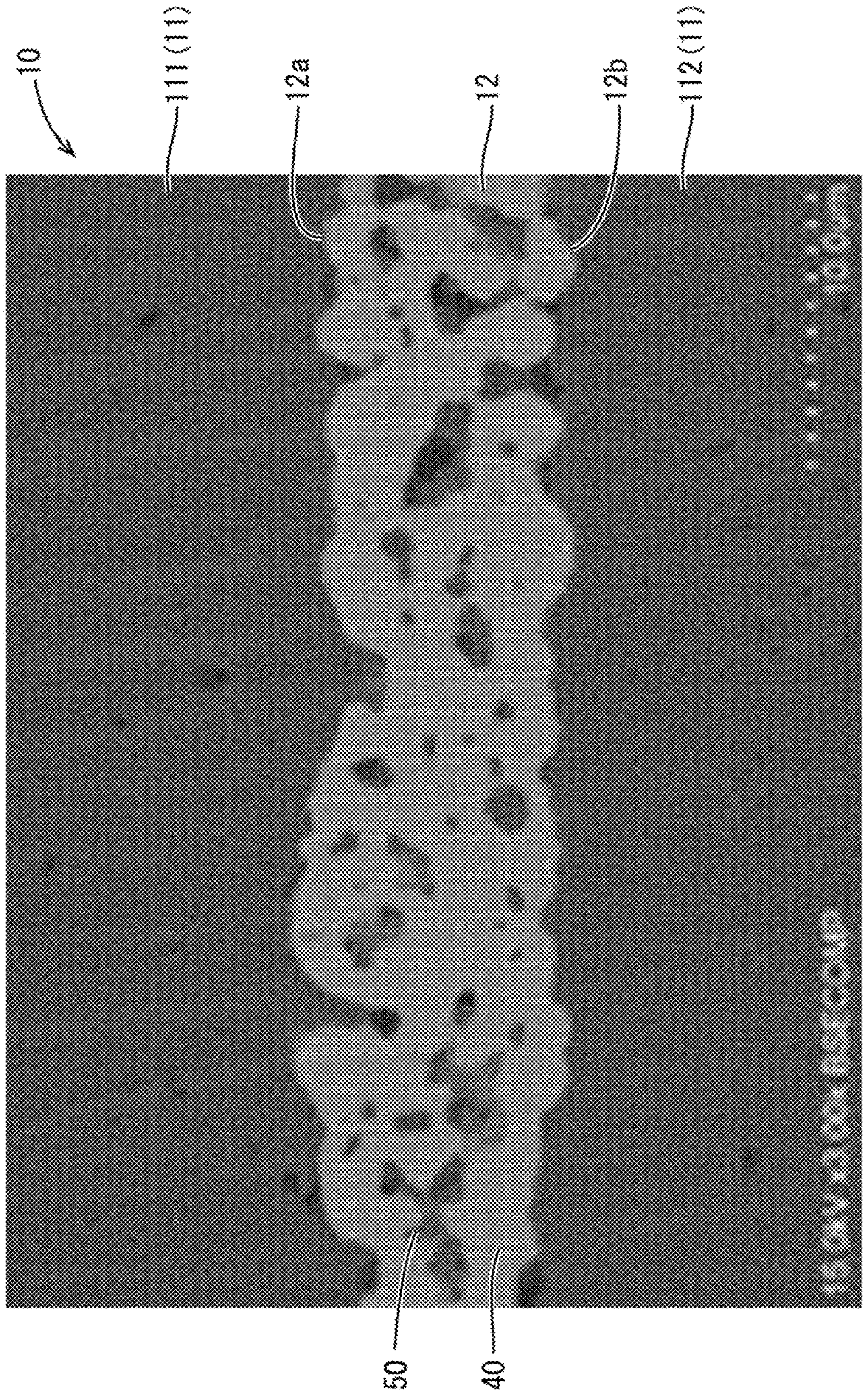
FIG. 3 illustrates a SEM image of a cross-section of an electrode layer in the plate member in a thickness direction.

FIG. 3 illustrates a SEM image of a cross-section of the electrode layer 12 in the plate member 11 in a thickness direction. According to the present embodiment, as illustrated in FIG. 3, a surface 12*a* of the electrode layer 12 facing the first surface S1 (upward) is roughened. That is, the surface 12*a* of the electrode layer 12 is an uneven surface that includes many projecting portions and many recessed portions.

The fractal dimension D of the surface 12*a* of the electrode layer 12 facing the first surface S1 is 1.18 or more. The fractal dimension of the surface 12*a* of the electrode layer 12 is obtained by using a box counting method.

A fractal dimension D of 1.18 or more means that the shape of the surface 12*a* of the electrode layer 12 is complex. The fractal dimension serves as an indicator of geometrical complexness. According to the present embodiment, a fractal dimension (that is, a two dimensional fractal dimension) with the electrode layer 12 viewed in a cross-section is defined. In the case where a contour shape regarding the two-dimensional fractal dimension, for example, is a simple shape such as a true circle, a square, or a rectangular, the fractal dimension is typically about 1. It is known that as the shape becomes more complex such as a shape that includes many projecting portions and recessed portions, the fractal dimension increases and approaches 2.

A method (principle) of analyzing the fractal dimension by using the box counting method will now be briefly described. For example, the fractal dimension of a figure present in a certain plane is defined as D when N (d) and d satisfy a relationship:

$$N(d) = ad^{-D} \text{ (} a \text{ is a positive integer)} \quad \text{(I)}$$

where the figure is divided into squares each of which has a side that has a length of d, and the figure is covered by N (d) squares.

The logarithms of both sides of the expression (I) described above are expressed as:

$$\log_{10}N(d) = -D \cdot \log_{10}d + \log_{10}a \text{ (} a \text{ is a positive integer)} \quad \text{(II)}$$

The logarithms of d and N(d) are plotted, and the fractal dimension D can be consequently obtained from the slope of a straight line thereof.

Figure 4:
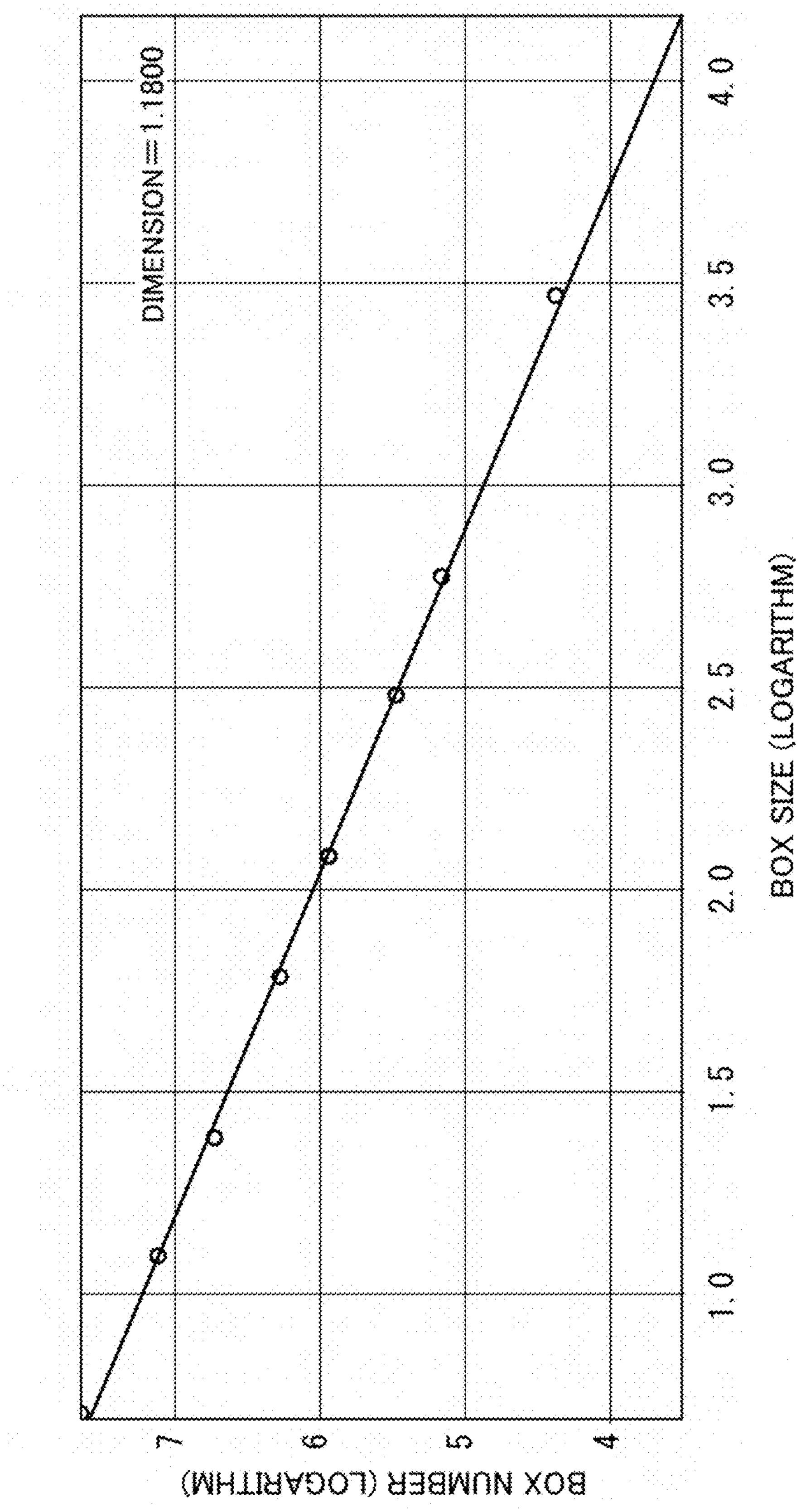
FIG. 4 illustrates a graph in which a box pixel size (d) and a box number (N(d)) are plotted on a common logarithmic scale, based on a contour line of a surface that is extracted from a cross-section of the electrode layer.

FIG. 4 illustrates a graph in which a box pixel size (d) and a box number (N(d)) are plotted on a common logarithmic scale, based on a contour line of the surface 12*a* that is extracted from a cross-section of the electrode layer 12. A method of obtaining the fractal dimension by using the box counting method will be described in detail later.

According to the present embodiment, a surface 12*b* of the electrode layer 12 facing the second surface S2 (downward) is not roughened, is less uneven than the surface 12*a*, and is a flat surface. That is, the electrode layer 12 according to the present embodiment is roughened such that at least the surface 12*a* facing the first surface S1 on which the wafer W is placed is an uneven surface that is expressed by using the desired fractal dimension D.

According to the present embodiment, the area ratio of the ceramic to an observation range that is set at the center of the electrode layer 12 in a cross-section of the electrode layer 12 in the thickness direction is 30% or less.

As illustrated in the SEM image in FIG. 3, a conductive material 40 that is the main component of the electrode layer 12 is present in a layered shape. Multiple lumps of the ceramic (alumina) 50 are present in the conductive material 40 in the layered shape. According to the present embodiment, the ceramic 50 is not present in a form in which the ceramic 50 connects the first dielectric layer 111 and the second dielectric layer 112 to each other in a cross-section of the electrode layer 12. That is, according to the present embodiment, the ceramic 50 is not present in a form in which the ceramic 50 extends through the electrode layer 12 (the conductive material) in the thickness direction. An upper surface of the conductive material 40 in the layered shape corresponds to the surface 12*a* of the electrode layer 12. A lower surface of the conductive material 40 corresponds to the surface 12*b* of the electrode layer 12.

When the area ratio of the ceramic described above is 30% or less (preferably 25% or less), the electrode layer 12 has excellent thermal conductivity. A method of calculating the area ratio of the ceramic described above in a cross-section of the electrode layer 12 in the thickness direction will be described later. The lower limit of the area ratio described above is preferably 3% or more and more preferably 5% or more from the perspective of, for example, ensuring adhesion between the electrode layer 12 and the plate member 11.

The holding substrate 10 may include another component such as a gas flow path for supplying inert gas (for example, helium gas that is heat conduction gas) to the first surface S1.

For example, the base member 20 is composed of a metal (such as aluminum or an aluminum alloy), a metal-ceramic composite (Al—SiC), or a ceramic (SiC) as a main component.

Refrigerant flow paths 21 that serve as a cooling mechanism are provided in the base member 20. Refrigerant (such as a fluorine inert liquid or water) flows into the refrigerant flow paths 21, and plasma heat is consequently cooled. When the refrigerant flows into the refrigerant flow paths 21, the base member 20 is cooled, and the holding substrate 10 is cooled due to heat transfer (heat conduction) between the base member 20 and the holding substrate 10 via the joining material 30. Consequently, the wafer W that is held on the first surface S1 of the holding substrate 10 is cooled. The flow rate of the refrigerant on the refrigerant flow paths 21 is appropriately adjusted, and the temperature of the wafer W that is held on the first surface S1 can be consequently controlled.

The base member 20 may include another component such as a gas flow path for supplying inert gas.

For example, the joining material 30 is composed of, for example, a bonding sheet that contains a silicone organic adhesive or inorganic adhesive or an Al metal adhesive. The joining material preferably has strong adhesive force to both of the holding substrate 10 and the base member 20 and has high pressure resistance and thermal conductivity. The joining material 30 may has a gas flow path for supplying inert gas as needed.

An example of a method of manufacturing the holding apparatus 100 according to the present embodiment will now be described. A method of manufacturing the holding substrate 10 that is included in the holding apparatus 100 will be first described with reference to FIG. 5A to FIG. 5E. FIG. 5A to FIG. 5E schematically illustrate the method of manufacturing the holding substrate 10. In the method of manufacturing the holding substrate 10, a sheet stacking method of using a green sheet (a ceramic green sheet) is used.

Figure 5A:
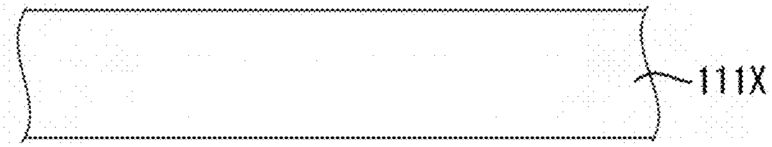
FIG. 5A to FIG. 5E schematically illustrate a method of manufacturing the holding substrate.

As illustrated in FIG. 5A, multiple green sheets are stacked, and a first laminate 111X is prepared in order to form the first dielectric layer 111 of the plate member 11. For example, a slurry for the green sheets is obtained by adding an organic solvent into a mixture that contains alumina powder, an acrylic binder, a dispersant, a plasticizer, a sintering additive (such as glass or rare earth oxide), and so on and mixing these by using a ball mill. The slurry is molded into a sheet by using a casting device. Subsequently, an obtained molded piece is dried, and the multiple green sheets are obtained.

Figure 5B:
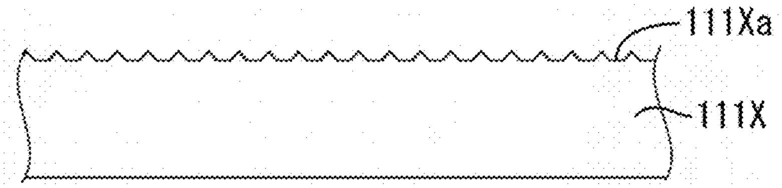

Subsequently, as illustrated in FIG. 5B, a surface roughening process is performed on a surface 111Xa of the first laminate 111X. The surface roughening process is performed to roughen the surface 12*a* of the electrode layer 12 that is finally obtained such that the surface becomes an uneven surface that is expressed by using the desired fractal dimension D. The surface roughening process may be directly performed on a surface of a metallizing paste 12X for forming the electrode layer 12 or may be performed on the surface 111Xa of an opponent (the first laminate 111X) to be in contact with the surface. In an example described herein, the surface roughening process is performed on the surface 111Xa of the first laminate 111X that is the opponent.

The surface roughening process is not particularly limited provided that the desired fractal dimension D (1.18 or more) is obtained. For example, a sandblasting process, a sputtering process, a corona (discharge) process, a flaming process, an ultraviolet radiation process, or an electron beam radiation process may be performed.

Figure 5C:
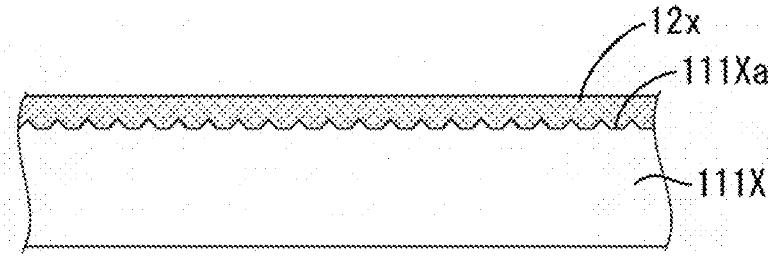

Subsequently, as illustrated in FIG. 5C, the metallizing paste 12X for forming the electrode layer 12 is stacked on the surface 111Xa of the first laminate 111X after the surface roughening process. The metallizing paste 12X is obtained by adding a conductive powder (a main component) such as tungsten or molybdenum into a mixture of alumina powder (a sub-component), an acrylic binder, and an organic solvent and kneading these. For example, the metallizing paste 12X is formed on the surface 111Xa of the first laminate 111X into a layered shape by using a screen printing device. The metallizing paste 12X is thus formed into a layered shape, and the surface in contact with the surface 111Xa of the first laminate 111X finally becomes an uneven surface that is expressed by using the desired fractal dimension D (1.18 or more).

A green sheet (not illustrated) that has a frame shape surrounding the metallizing paste 12X is disposed around the metallizing paste 12X when the metallizing paste 12X on the first laminate 111X is viewed in plan view. The green sheet that has the frame shape is disposed at a position on the surface 111Xa of the first laminate 111X at which the metallizing paste 12X is not formed.

Figure 5D:
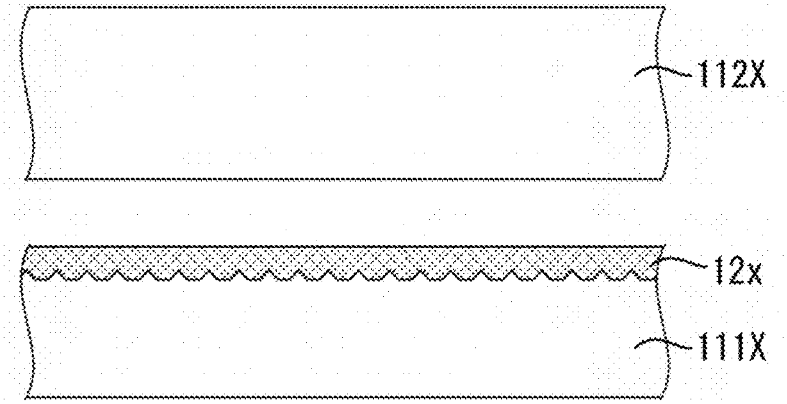

Subsequently, as illustrated in FIG. 5D, a second laminate 112X for forming the second dielectric layer 112 of the plate member 11 is prepared, and the second laminate 112X is stacked on the metallizing paste 12X on the first laminate 111X.

The second laminate 112X is formed by stacking multiple green sheets as in the first laminate 111X described above. The second laminate 112X thus formed is stacked on the metallizing paste 12X on the first laminate 111X so as to interpose the metallizing paste 12X together with the first laminate 111X. These laminates are bonded to each other by thermal bonding.

Figure 5E:
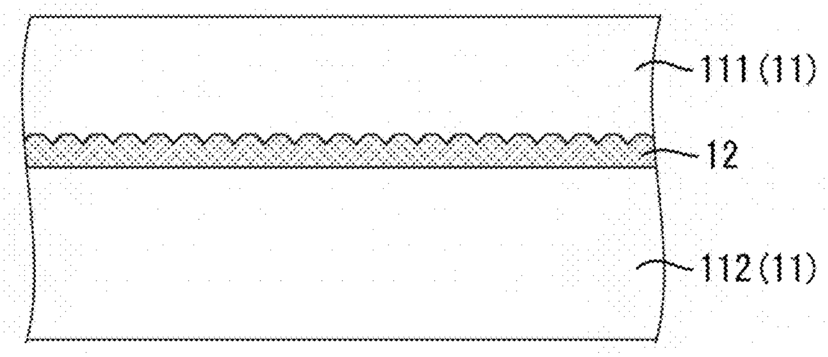

The outer circumferences of the laminates of the first laminate 111X, the metallizing paste 12*x*, and the second laminate 112X may be appropriately cut. The laminates are cut by machining, and a molded body that has a disk shape is obtained. Subsequently, the obtained molded body is degreased and fired. The molded body that is degreased and fired is sintered (regular firing), and a sintered body is consequently obtained. Subsequently, for example, the surface of the sintered body is appropriately processed and polished, and the holding substrate 10 that includes the plate member 11 as illustrated in FIG. 5E is consequently obtained.

A method of manufacturing the base member 20 is basically the same as a method of manufacturing an existing product. For this reason, the detailed description thereof is omitted.

The holding substrate 10 and the base member 20 are manufactured and are subsequently joined to each other by using the joining material 30. The holding substrate 10 and the base member 20 are joined to each other by using the joining material 30 basically in the same manner as joining for an existing product. For this reason, the detailed description thereof is omitted. In this way, the holding apparatus 100 is manufactured.

The holding apparatus 100 according to the present embodiment includes the holding substrate 10 that has excellent heat removal properties (thermal conductivity) and in which the adhesion between the plate member 11 that contains high purity alumina (an example of a ceramic) as the main component and the electrode layer 12 that is disposed in the plate member 11 is excellent.

The electrode layer 12 contains, as the sub-component, alumina in a predetermined amount in addition to the conductive material 40 is that the main component.

Accordingly, the surface 12*a* of the electrode layer 12 can be an uneven surface having a fractal dimension D of 1.18 or more. The adhesion between the surface 12*a* of the electrode layer 12 and the surface of the first dielectric layer 111 adjacent thereto is excellent. Accordingly, a gap (a space) that hinders the transfer of heat can be inhibited from being formed therebetween.

The amount of alumina in the electrode layer 12 is relatively small. Accordingly, the electrode layer 12 does not contain a ceramic (alumina) 50 that has poor thermal conductivity and that is in a form in which the ceramic 50 connects the first dielectric layer 111 and the second dielectric layer 112 to each other, and is mainly composed of the conductive material 40 that has excellent thermal conductivity. For this reason, the electrode layer 12 according to the present embodiment itself has excellent thermal conductivity. Even though the first dielectric layer 111 that is stacked on the surface 12*a* of the electrode layer 12 is heated during the plasma processing, heat can be quickly transferred from the first dielectric layer 111 to the electrode layer 12. The heat that is transferred to the electrode layer 12 is transferred to the second dielectric layer 112 and is transferred to the base member 20. The holding apparatus 100 that includes the holding substrate 10 has excellent heat removal properties (thermal conductivity).

According to the present embodiment, the area ratio of the surface 12*a* of the electrode layer 12 to the first surface S1 is 80% or more when the plate member 11 is viewed in plan view from the front surface (the first surface S1). Accordingly, it can be said that the electrode layer 12 greatly affects the heat removal properties (thermal conductivity) of the holding substrate 10 (the holding apparatus 100).

Second Embodiment

Figure 6:
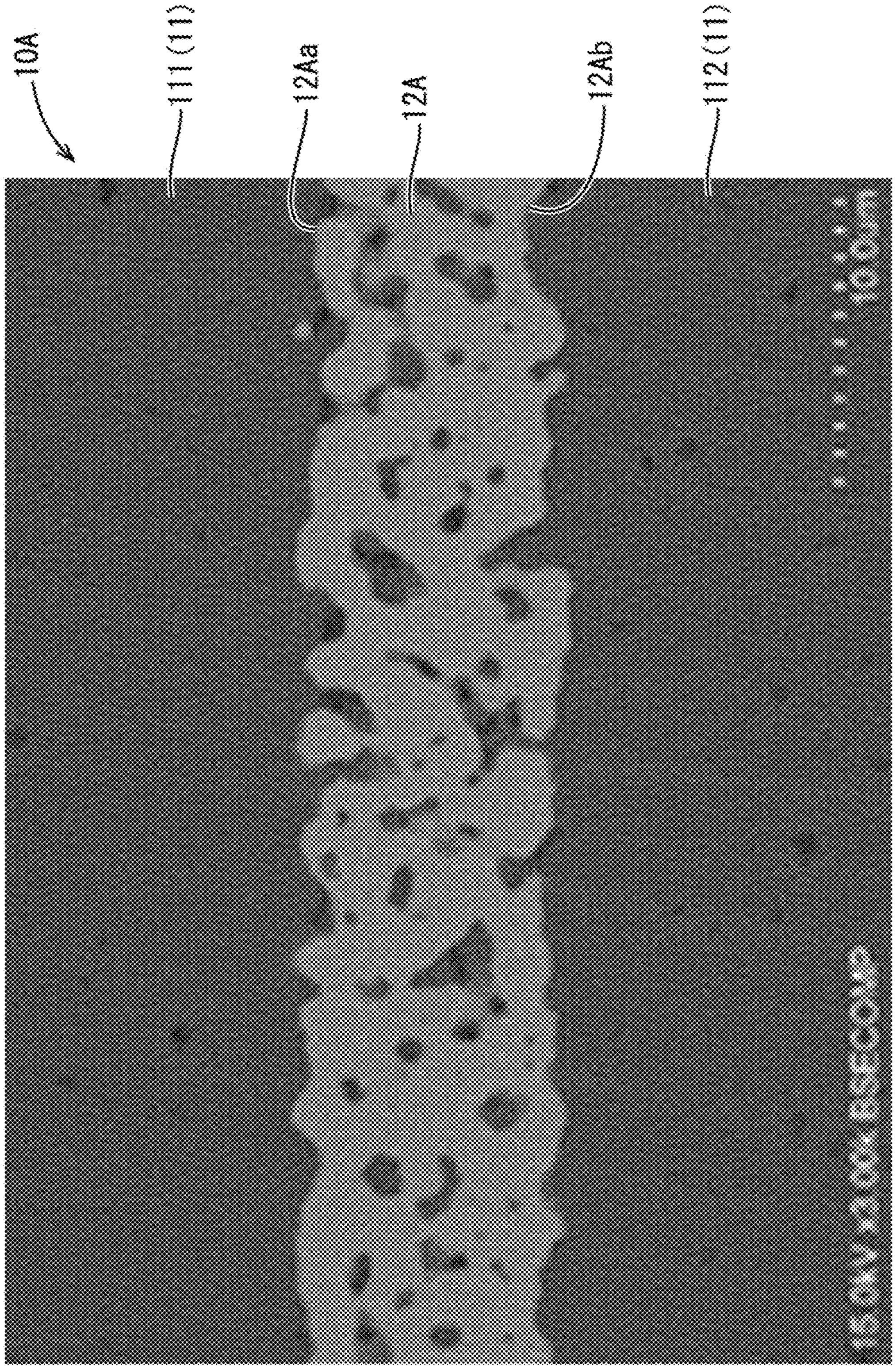
FIG. 6 illustrates a SEM image of a cross-section in the thickness direction of the plate member that is included in a holding substrate according to a second embodiment.

A holding substrate 10A that is included in a holding apparatus according to a second embodiment will now be described with reference to FIG. 6. FIG. 6 illustrates a SEM image of a cross-section in the thickness direction of the plate member 11 that is included in the holding substrate 10A according to the second embodiment. According to the present embodiment, both surfaces of an electrode layer 12A that is formed in the plate member 11 are roughened. A surface 12Aa of the electrode layer 12A facing the first surface (upward) and a surface 12Ab facing the second surface (downward) are uneven surfaces that include many projecting portions and many recessed portions. The holding apparatus (the holding substrate 10A) according to the present embodiment basically has the same structure as that according to the first embodiment except that both surfaces of the electrode layer 12A are roughened.

The fractal dimension D of the surface 12Aa of the electrode layer 12A and the fractal dimension D of the surface 12Ab of the electrode layer 12A are 1.18 or more.

Also according to the present embodiment, the area ratio of the ceramic to an observation range that is set at the center of the electrode layer 12A in a cross-section of the electrode layer 12A in the thickness direction is 30% or less as in the first embodiment.

An example of a method of roughening the surface 12Aa of the electrode layer 12A facing upward is a method of performing the surface roughening process described above on the surface of the first laminate of the green sheet for forming the first dielectric layer 111 and stacking the metallizing paste for forming the electrode layer 12A on the surface of the first laminate during the manufacture of the holding substrate 10A.

An example of a method of roughening the surface 12Ab of the electrode layer 12A facing downward is a method of performing the surface roughening process described above on the surface of the second laminate of the green sheet for forming the second dielectric layer 112 and stacking the second laminate on the metallizing paste such that the surface of the second laminate is pressed against the metallizing paste on the first laminate during the manufacture of the holding substrate 10A.

According to the present embodiment, the surface 12Ab facing downward may be roughened so as to include an uneven surface that is expressed by using the desired fractal dimension D (1.18 or more) in addition to the surface 12Aa of the electrode layer 12A facing upward. Both surfaces of the electrode layer 12A are thus roughened, and consequently, the heat removal properties (thermal conductivity) of the holding substrate 10A (the holding apparatus) according to the present embodiment are excellent.

EXAMPLES

The present invention will be described in more detail below based on examples. The present invention is not limited to the examples.

Example 1

Manufacture of Metallizing Paste

A metallizing paste was manufactured by adding a conductive powder into a mixture of alumina powder, an acrylic binder, and an organic solvent and kneading these. The amount of the alumina powder in the metallizing paste was adjusted to 20% by volume relative to a total volume of 100% including the alumina powder and the conductive powder.

Manufacture of Green Sheet

A slurry for a green sheet for forming a high purity plate member (the content of alumina was 99.5% by mass or more) was manufactured by adding an organic solvent into a mixture of alumina powder, an acrylic binder, a dispersant, a plasticizer, a sintering additive, and so on and mixing these by using a ball mill.

Manufacture of Holding Substrate

A sample of Example 1 that imitated the holding substrate was manufactured in the same manner as in the method of manufacturing the holding substrate described according to the first embodiment except that the obtained metallizing paste and the slurry for the green sheet were used. In Example 1, only an upper surface of the metallizing paste that had a layered shape for forming the electrode layer was roughened by performing the surface roughening process.

Examples 2 to 4

Samples in Examples 2 to 4 were manufactured in the same manner as in Example 1 except that the amount of the alumina powder in the metallizing paste was changed to a value (in % by volume) illustrated in Table 1. In Examples 2 to 4, a slurry for forming a high purity plate member in which the content of alumina was 99.5% by mass or more was manufactured.

Comparative Examples 1 to 3

Samples in Comparative Examples 1 to 3 were manufactured in the same manner as in Comparative Example 1 except that the amount of alumina powder in the metallizing paste was changed to values (in % by volume) illustrated in Table 1. In Comparative Examples 1 to 3, a slurry for forming a high purity plate member in which the content of alumina was 99.5% by mass or more was manufactured.

Evaluation

As for the samples in Examples and Comparative Examples, the "area ratio of the ceramic in a cross-section of the electrode layer", the "fractal dimension D of the surface of the electrode layer", the "strength of adhesion", and the "thermal conductivity", for example, were evaluated in the following manner.

Area Ratio of Ceramic in Cross-Section of Electrode Layer

Figure 7:
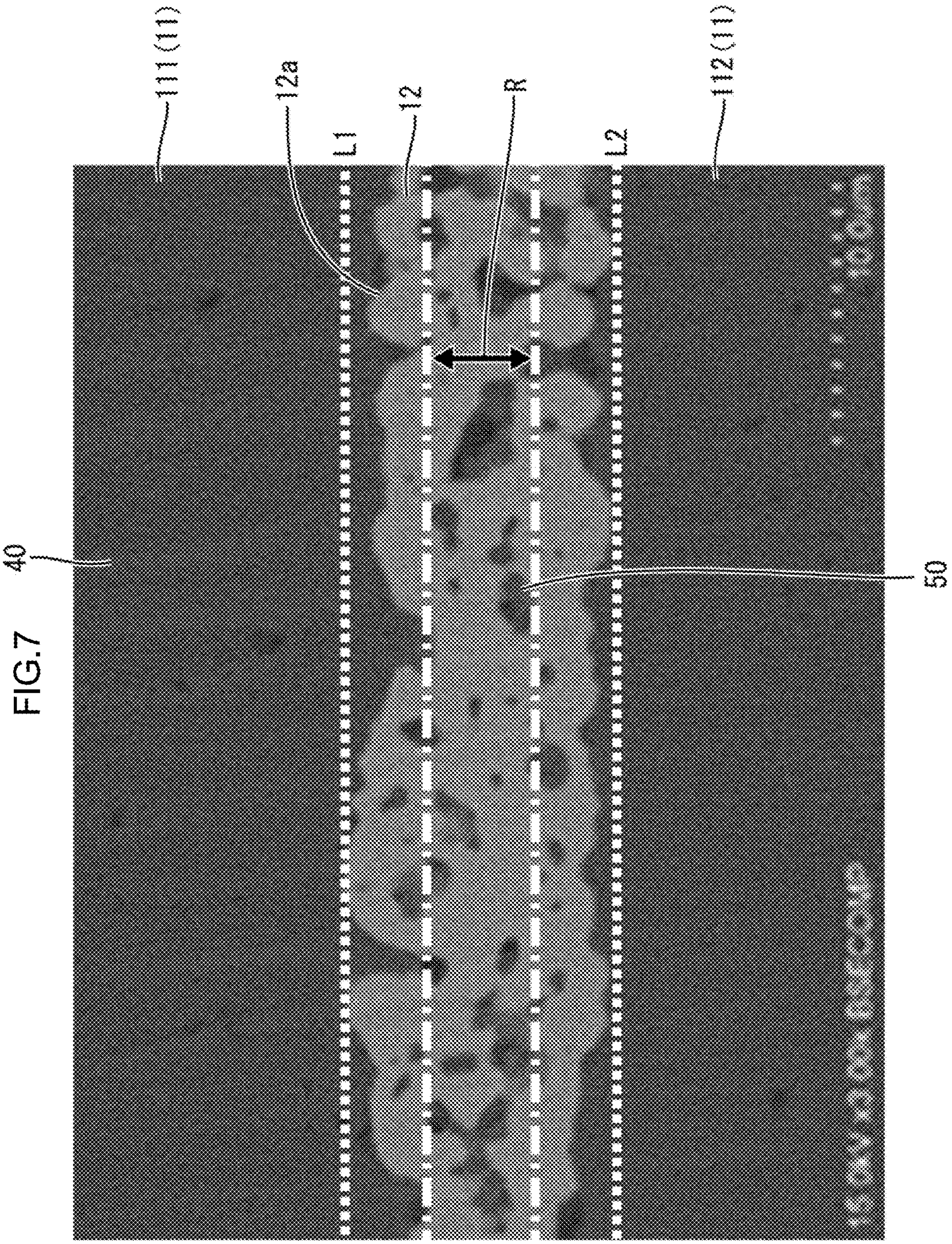
FIG. 7 illustrates an observation range that is set at the center of the electrode layer in the SEM image of the cross-section.

Each sample that imitated the holding substrate was cut in the thickness direction, and the obtained cross-section was polished. Subsequently, the SEM image (magnification was 3000 times) of the cross-section was captured by using a scanning electron microscope (SEM). FIG. 7 illustrates an observation range R that is set at the center of the electrode layer 12 in the SEM image of the cross-section. As illustrated in FIG. 7, the observation range R is set between an upper reference line L1 that linearly extends through the uppermost portion (the top) of the electrode layer 12 and a lower reference line L2 that linearly extends through the lowermost portion (the bottom). The upper reference line L1 and the lower reference line L2 are parallel with each other. In the case where a range between the upper reference line L1 and the lower reference line L2 is regarded as 100%, the observation range R corresponds to a region that is obtained by removing a 30% portion away downward from the upper reference line L1 and removing a 30% portion away upward from the lower reference line L2. That is, the observation range R includes a 40% central portion in the range (100%) that is interposed between the upper reference line L1 and the lower reference line L2.

Subsequently, a binarization process was performed on the SEM image. From an obtained binarization image, the conductive material 40 that formed the electrode layer 12 and the ceramic 50 present in the conductive material 40 were distinguished by using image processing software. The area ratio of the ceramic to the observation range R (100%) was obtained by using the image processing software. The observation range R was set at three positions for every sample. The area ratio was obtained as the average of values at the three positions. The result is illustrated in Table 1.

Fractal Dimension D

Figure 8A:
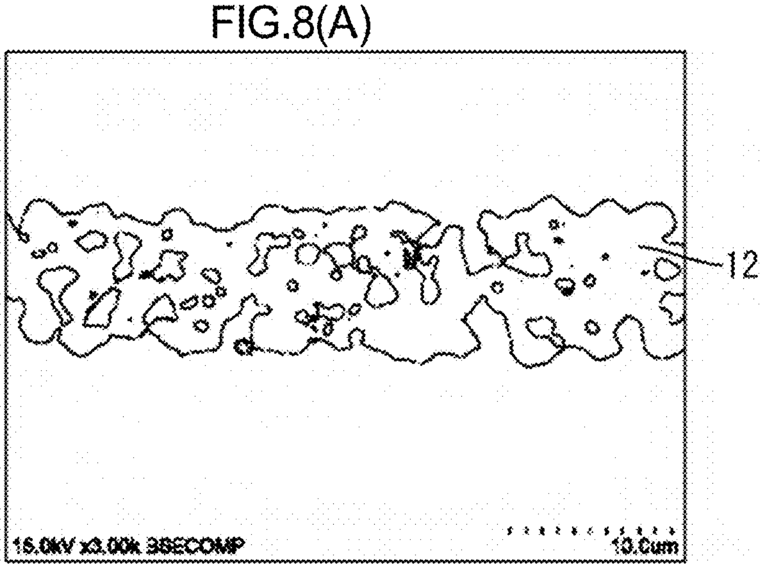
FIG. 8A to FIG. 8C illustrate diagrams for describing image processing that is performed when a fractal dimension D is obtained.
Figure 8B:
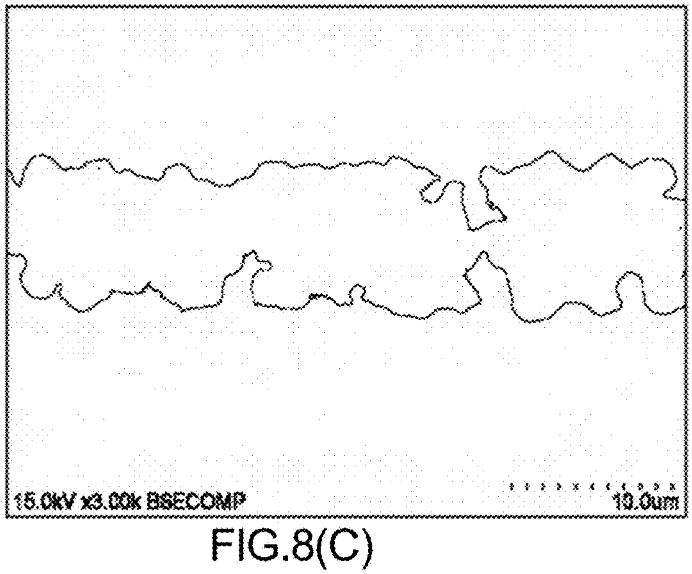
Figure 8C:
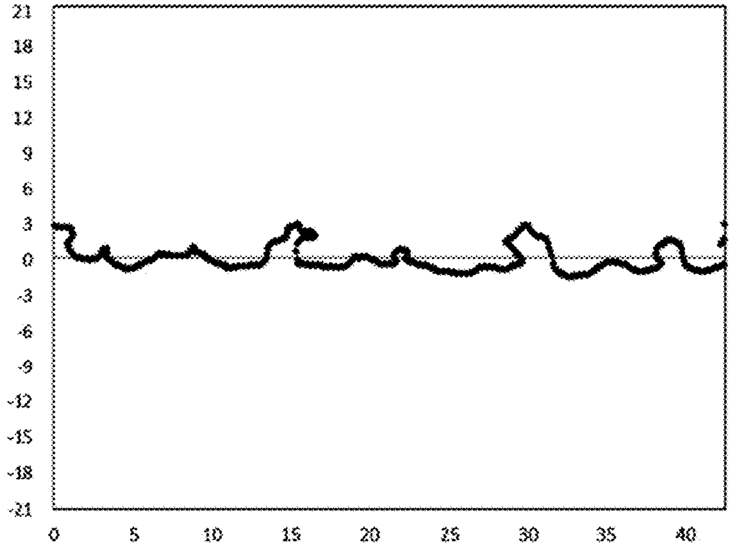

The fractal dimension D of the surface of the electrode layer of each sample was obtained by using a box counting method described later. FIG. 8A to FIG. 8C illustrate diagrams for describing image processing that is performed when the fractal dimension D is obtained. The binarization process was performed on the SEM image (the magnification was 3000 times) that was captured during the evaluation of the area ratio described above in a cross-section of the electrode layer by using image processing software (ImageJ made by Wayne Rasband in National Institutes of Health), and a contour line of the electrode layer 12 (the conductive material 40) was extracted from an obtained binarization image. FIG. 8A illustrates an example of an image obtained by extracting the contour line. The contour line of the electrode layer 12 illustrated in a lower portion in FIG. 8A corresponds to the roughened surface. Subsequently, as illustrated in FIG. 8B, a portion inside the contour line was printed out by using the image processing software described above, and a contour line portion corresponding to the roughened surface was extracted from an obtained printed image as illustrated in FIG. 8C. As illustrated in FIG. 8C, coordinates were set for the extracted contour line portion.

Subsequently, as for the extracted contour line portion, a box counting tool of the image processing software described above was used, the length d of a side of a square box was changed stepwise from 2 to 64 pixels (2, 3, 4, 6, 8, 12, 16, 32, 64), and a coverage rate N (d) of d was measured. The obtained length d of the side of the square box and the corresponding coverage rate N (d) were plotted on a common logarithmic scale in accordance with the expression (II) described above, and the fractal dimension was calculated from the slope of a straight line thereof. The result is illustrated in Table 1.

Surface Roughness Ra

For reference, the surface roughness (arithmetic average roughness) Ra of the electrode layer in each sample was obtained based on a contour portion (roughness curve) illustrated in FIG. 8C in accordance with JIS B0601-2001. The result is illustrated in Table 1.

The surface roughness Ra is expressed by using a value that is expressed as an expression (1) described below in the unit of the micrometer (μm) where a portion that has a reference length L is extracted from the contour portion (the roughness curve) described above in the direction of an average line thereof, and an X-axis is set in the direction of the average line of the extracted portion, a Y-axis is set in the direction of a vertical magnification, and the roughness curve is expressed as y=f(X).

$$Ra = \frac{1}{L}\int_0^L |f(x)|dx \tag{1}$$

Strength of Adhesion

Figure 9:
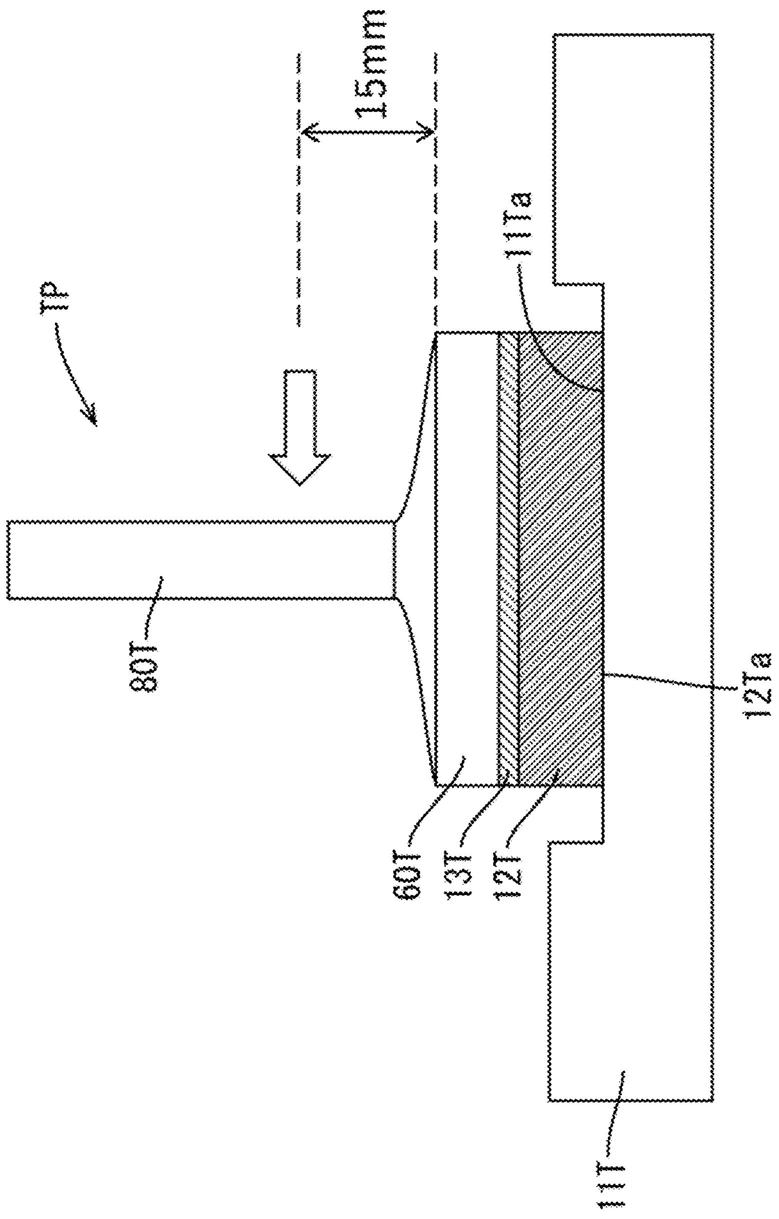
FIG. 9 schematically illustrates a test piece used for the measurement of the strength of adhesion.

A test piece TP illustrated in FIG. 9 was manufactured by using the metallizing paste for the electrode layer that was manufactured in, for example, each example. FIG. 9 schematically illustrates the test piece TP used for the measurement of the strength of adhesion. The test piece TP illustrated in FIG. 9 included a multilayer body in which a test electrode layer 12T and a conductive electrode layer (an electrode layer for attaching plating) 13T were formed on a surface 11Ta of a test plate member 11T that included a recessed portion. A rod-shaped Kovar terminal 80T was fixed to the conductive electrode layer 13T of the multilayer body by using a nickel plating layer 60T and a brazing material (Ag—Cu). In FIG. 9, a roughened surface of the test electrode layer 12T is illustrated by using a reference character 12Ta for convenience of description.

The test plate member 11T was manufactured by using the slurry for the green sheet that was prepared in, for example, Example 1.

As for the test piece TP in each of Examples 1 to 4, the test electrode layer 12T was formed on the surface 11Ta of the test plate member 11T that was roughened by performing the surface roughening process as in the manufacture of each sample that imitated the holding substrate described above.

Figure 10:
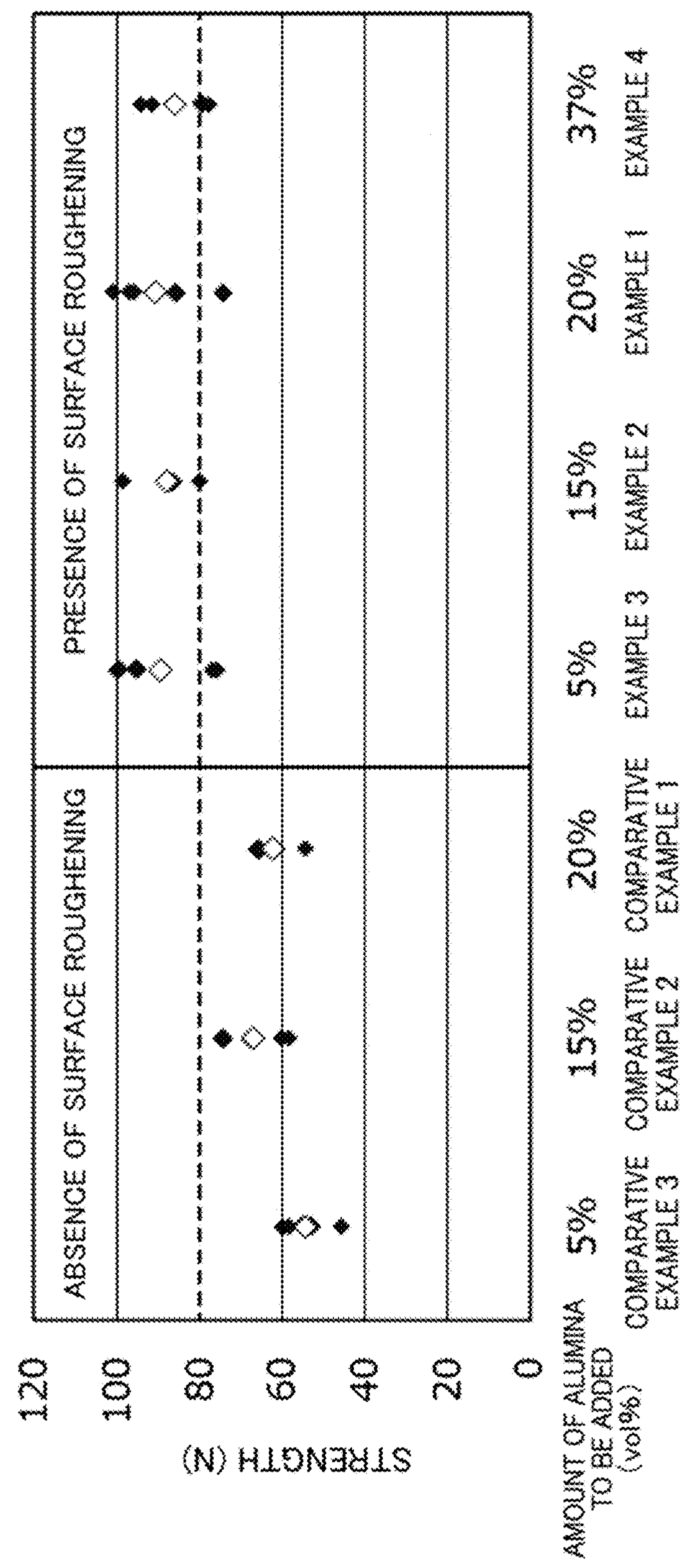
FIG. 10 is a graph illustrating a summary of the result of the measurement of the strength (N) of adhesion of the electrode layer in each of Examples and Comparative Examples.

As for the test piece TP thus manufactured, the strength of adhesion of the test electrode layer 12T was measured by using AUTOGRAPH (a precision universal testing machine) made by SHIMADZU CORPORATION in the following manner. Specifically, pressing force was applied to the Kovar terminal 80T at a position 15 mm away from a base by using AUTOGRAPH in a condition of 5 mm/min with the multilayer body of the test piece TP fixed such that the rod-shaped Kovar terminal 80T extending in the horizontal direction. The strength (N) when the test piece TP to which the force was applied was broken was measured. In each of Examples and Comparative Examples, the measurement of the strength (N) was made five times. The result is illustrated in FIG. 10. FIG. 10 is a graph illustrating a summary of the result of the measurement of the strength (N) of adhesion of the electrode layer in each of Examples and Comparative Examples. The average of the five measurement results was determined to be the strength (N) of adhesion in, for example, Examples. The case where the strength (N) of adhesion was 80 N or more was evaluated as the "presence of adhesion", and the case where the strength (N) of adhesion was less than 80 N was evaluated as the "absence of adhesion". In Table 1, the "presence of adhesion" is expressed as a symbol "o", and the "absence of adhesion" is expressed as a symbol "x".

Thermal Conductivity

A test electrode layer was manufactured by using the metallizing paste for the electrode layer manufactured in, for example, each of Examples. The thermal conductivity was measured by using the obtained test electrode layer in the following manner. The result is illustrated in Table 1.

The metallizing paste for the electrode layer was molded into a predetermined shape after being degreased, an obtained molded body was fired, and a fired body was obtained. Subsequently, the fired body was appropriately cut and polished. Subsequently, as for the fired body, a thermal diffusion ratio and specific heat were measured based on a laser flash method in accordance with JIS R1611. As for the fired body, bulk density was measured in accordance with JIS R1634. The thermal diffusion ratio, the specific heat, and the bulk density that were thus obtained were multiplied, and the result was used as the thermal conductivity.

TABLE 1

| | Electrode layer | | | | | | |
|---|---|---|---|---|---|---|---|
| | Alumina (vol %) | Surface roughening | Fractal dimension D | Ra (μm) | Area ratio of alumina (%) | Adhesion | Thermal conductivity (W/mK) |
| Example 1 | 20 | Presence | 1.190 | 0.663 | 23.7 | ○ | 63.4 |
| Example 2 | 15 | Presence | 1.193 | 0.610 | 16.2 | ○ | 68.2 |
| Example 3 | 5 | Presence | 1.188 | 0.393 | 4.5 | ○ | 76.2 |
| Example 4 | 37 | Presence | 1.216 | 1.190 | 36.2 | ○ | 48.7 |
| Comparative Example 1 | 20 | Absence | 1.179 | 0.521 | 16.4 | x | 63.4 |
| Comparative Example 2 | 15 | Absence | 1.177 | 0.457 | 14 | x | 68.2 |
| Comparative Example 3 | 5 | Absence | 1.179 | 0.264 | 5.7 | x | 76.2 |

Regarding Adhesion

From the result of the test of the strength of adhesion described above, it was confirmed that the electrode layer in each of Examples 1 to 4 had excellent adhesion to the plate member (high purity alumina). In Examples 1 to 3, the content (5 to 20 vol %) of alumina in the electrode layer was relatively low, but the surface of the electrode layer was roughened so as to have the desired fractal dimension D (1.18 or more). Also in Example 4, the surface of the electrode layer was roughened so as to have the desired fractal dimension D (1.18 or more). In Examples 1 to 4, the test piece TP was not broken at the interface between the electrode layer and the plate member but was broken in the electrode layer while the strength of adhesion was tested by using AUTOGRAPH.

However, it was confirmed that the electrode layer in each of Comparative Examples 1 to 3 did not have sufficient adhesion to the plate member (high purity alumina). In Comparative Examples 1 to 3, the content (5 to 20 vol %) of alumina in the electrode layer was relatively low, and accordingly, it can be said that the sufficient adhesion to the plate member was not obtained because the surface of the electrode layer was not roughened so as to have the desired fractal dimension D. In Comparative Examples 1 to 3, the test piece TP was broken at the interface between the electrode layer and the plate member while the strength of adhesion was tested by using AUTOGRAPH.

Regarding Thermal Conductivity

As illustrated in Table 1, it was confirmed that as the content of alumina in the electrode layer increased, the thermal conductivity of the electrode layer decreased. In particular, the electrode layer in each of Examples 1 to 3 among Examples 1 to 4 had a thermal conductivity of 60 W/mK or more and had excellent thermal conductivity. The electrode layer in each of Comparative Examples 1 to 3 had excellent thermal conductivity although the adhesion to the plate member was not sufficient as described above.

Relationship Between Fractal Dimension D and Adhesion

Figure 11:
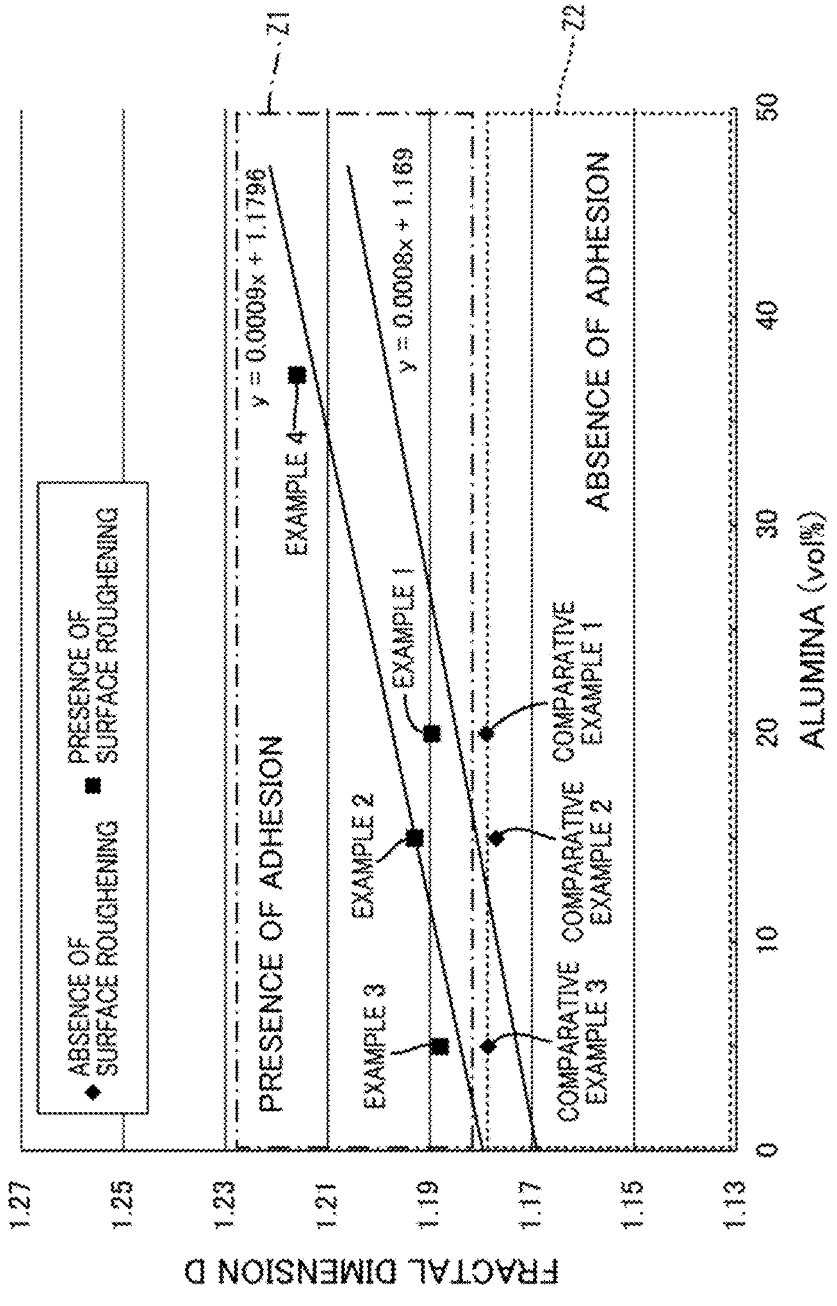
FIG. 11 is a graph illustrating a summary of relationships between the fractal dimension D of the electrode layer and the adhesion of the electrode layer in each of Examples and Comparative Examples.

In FIG. 11, a relationship between the fractal dimension D of the electrode layer and the adhesion of the electrode layer in each of Examples and Comparative Examples is summarized. The vertical axis of a graph in FIG. 11 represents the fractal dimension D, and the horizontal axis represents the content (vol %) of alumina contained in the electrode layer. In the graph in FIG. 11, Examples and Comparative Examples are distinguished into the case where the strength of adhesion of the electrode layer is 80 N or more (the presence of adhesion) and the case where the strength of adhesion of the electrode layer is less than 80 N (the absence of adhesion), based on the fractal dimension D. Consequently, a range Z1 (the presence of adhesion) and a range Z2 (the absence of adhesion) illustrated in FIG. 11 can be set. The range Z1 and the range Z2 can be distinguished when the fractal dimension D is close to 1.18. From the graph in FIG. 11, it can be said that when the fractal dimension D of the surface of the electrode layer is 1.18 or more, the strength of adhesion of the electrode layer is ensured.

As illustrated in the graph in FIG. 11, there is a tendency that as the content (vol %) of alumina in the electrode layer increases, the fractal dimension D of the surface of the electrode layer increases. As illustrated in the graph in FIG. 11, the fractal dimension D in the case where the surface of the electrode layer is roughed is greater than that in the case where the surface is not roughened.

Relationship Between Surface Roughness Ra and Adhesion

Figure 12:
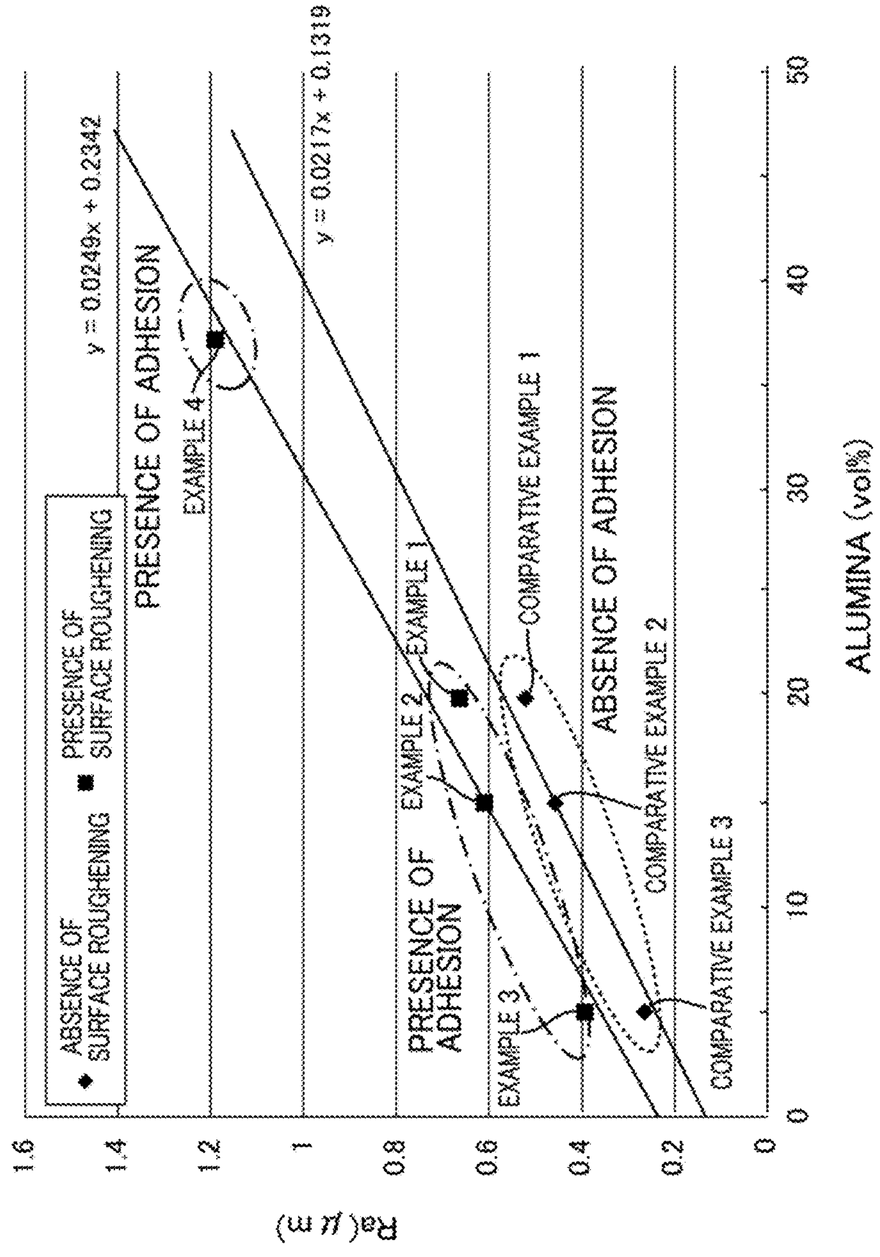
FIG. 12 is a graph illustrating a summary of relationships between the surface roughness Ra of the electrode layer and the adhesion of the electrode layer in each of Examples and Comparative Examples.

For reference, in FIG. 12, a relationship between the surface roughness Ra of the electrode layer and the adhesion of the electrode layer in each of Examples and Comparative Examples is summarized. The vertical axis of a graph in FIG. 12 represents the surface roughness Ra, and the horizontal axis represents the content (vol %) of alumina contained in the electrode layer. In the graph, Examples and Comparative Examples cannot be distinguished into the case where the strength of adhesion of the electrode layer is 80 N or more (the presence of adhesion) and the case where the strength of adhesion of the electrode layer is less than 80 N (the absence of adhesion), based on the surface roughness Ra. That is, it is necessary to express the adhesion of the electrode layer by using the fractal dimension D instead of the surface roughness Ra.

What is claimed is:

1. A holding apparatus comprising:

a holding substrate that has a first surface on which an object is to be held and a second surface opposite the first surface, the holding substrate including a plate member that contains a ceramic as a main component and an electrode layer that is disposed in the plate member, that contains a conductive material as a main component, and that contains the ceramic as a subcomponent, wherein the plate member includes a first dielectric layer that is disposed on a surface of the electrode layer facing the first surface and in which a content of the main component is 99% by mass or more, and a second dielectric layer that is disposed on a surface of the electrode layer facing the second surface and in which a content of the main component is 99% by mass or more, and wherein a fractal dimension D of the surface of the electrode layer facing the first surface is 1.18 or more.

2. The holding apparatus according to claim 1, wherein an area ratio of the ceramic to an observation range that is set at a center of the electrode layer in a cross-section of the electrode layer in a thickness direction is 30% or less.

3. The holding apparatus according to claim 2, wherein the ceramic is not present in a form in which the ceramic connects the first dielectric layer and the second dielectric layer to each other in the cross-section of the electrode layer.

4. The holding apparatus according to claim 2, wherein an area ratio of the electrode layer to the first surface is 80% or more when the plate member is viewed in plan view.

5. The holding apparatus according to claim 1, wherein the ceramic is not present in a form in which the ceramic connects the first dielectric layer and the second dielectric layer to each other in the cross-section of the electrode layer.

6. The holding apparatus according to claim 1, wherein an area ratio of the electrode layer to the first surface is 80% or more when the plate member is viewed in plan view.

* * * * *